(12) United States Patent
Tanaka et al.

(10) Patent No.: US 7,305,878 B2
(45) Date of Patent: Dec. 11, 2007

(54) SENSOR EQUIPMENT HAVING SENSING PORTION AND METHOD FOR MANUFACTURING THE SAME

(75) Inventors: Masaaki Tanaka, Kariya (JP); Hiromi Ariyoshi, Kariya (JP); Tiaki Mizuno, Toyota (JP)

(73) Assignee: Denso Corporation, Kariya (JP)

( * ) Notice: Subject to any disclaimer, the term of this patent is extended or adjusted under 35 U.S.C. 154(b) by 70 days.

(21) Appl. No.: 11/149,134

(22) Filed: Jun. 10, 2005

(65) Prior Publication Data

US 2005/0284216 A1 Dec. 29, 2005

(30) Foreign Application Priority Data

Jun. 24, 2004 (JP) .............................. 2004-186045

(51) Int. Cl.
*G01F 1/68* (2006.01)
(52) U.S. Cl. ................................... 73/204.26
(58) Field of Classification Search ............ 73/204.26, 73/204.25, 204.22, 204.11; 257/292, 437, 257/639, 640
See application file for complete search history.

(56) References Cited

U.S. PATENT DOCUMENTS

| | | | |
|---|---|---|---|
| 5,158,801 A | 10/1992 | Hopson, Jr. et al. | |
| 6,635,912 B2 * | 10/2003 | Ohkubo | 257/292 |
| 6,701,782 B2 * | 3/2004 | Iwaki et al. | 73/204.26 |
| 6,988,399 B1 * | 1/2006 | Watanabe et al. | 73/204.26 |
| 2003/0233886 A1 | 12/2003 | Uramachi et al. | |

FOREIGN PATENT DOCUMENTS

| | | |
|---|---|---|
| JP | A-2000-2572 | 1/2000 |
| WO | WO 96/37333 | 11/1996 |

* cited by examiner

*Primary Examiner*—Jewel Thompson
(74) *Attorney, Agent, or Firm*—Posz Law Group, PLC

(57) ABSTRACT

Sensor equipment includes: a sensor device having a sensing portion; and an electric connection portion coated with an electric insulation member. The electric connection portion electrically connects an external circuit and the sensor device. The electric insulation member is a thin film disposed on the electric connection portion. In the sensor equipment, the insulation member is made of the deposition film, which is not deteriorated with time. Therefore, the insulation member does not flow out from the connection portion. Accordingly, detection sensitivity of the sensor equipment is prevented from reducing.

4 Claims, 3 Drawing Sheets

SENSOR EQUIPMENT HAVING SENSING PORTION AND METHOD FOR MANUFACTURING THE SAME

CROSS REFERENCE TO RELATED APPLICATION

This application is based on Japanese Patent Application No. 2004-186045 filed on Jun. 24, 2004, the disclosure of which is incorporated herein by reference.

FIELD OF THE INVENTION

The present invention relates to sensor equipment having a sensing portion and a method for manufacturing sensor equipment.

BACKGROUND OF THE INVENTION

Sensor equipment includes a sensor device with a sensing portion. The sensing portion is exposed outside to detect an object. The sensor device has a connector for connecting to an external circuit. The connector is protected with an electric insulation coating. The sensor equipment is, for example, disclosed in Japanese Patent Application Publication No. 2000-2572. The sensor equipment is a thermal type airflow sensor having a semiconductor substrate.

The airflow sensor has an airflow detection device as the sensor device. The airflow detection device is formed of a silicon substrate. A heat generating resistor, i.e., a heater as the sensing portion is formed on the surface of the substrate. When the air flows on the surface of the airflow detection device, the heat radiation of the heater is changed. This change is detected as a resistance change so that the airflow amount is measured by processing the resistance change with an electric circuit.

Here, the airflow detection device and the electric circuit are connected with a bonding wire electrically. An electric connector of the airflow detection device is coated with a sealing member such as an electric insulation member for protecting from erosion and the like.

In the prior art, the sealing member is made of gel. Therefore, when the gel of the sealing member is adhered to the heater of the airflow detection device, heat radiation of the heater is reduced. Thus, the airflow detection sensitivity of the device is reduced. Accordingly, the airflow detection device includes a stopper for preventing the sealing member from removing. The stopper is formed on the airflow detection device.

However, the sealing member is deteriorated with time, and therefore, the sealing member flows outside or flows on the surface of the airflow detection device. Thus, airflow detection sensitivity of the sensor equipment is reduced. This problem is occurred not only in the airflow sensor but also in a sensor having a sensing portion exposed outside and an electric connector protected with an electric insulation coating.

SUMMARY OF THE INVENTION

In view of the above-described problem, it is an object of the present invention to provide sensor equipment having a sensing portion, which is not contaminated by an insulation coating of an electric connection portion.

Sensor equipment includes: a sensor device having a sensing portion; and an electric connection portion coated with an electric insulation member. The electric connection portion electrically connects an external circuit and the sensor device. The electric insulation member is a thin film disposed on the electric connection portion. In the sensor equipment, the insulation member is made of the deposition film, which is not deteriorated with time. Therefore, the insulation member does not flow out from the connection portion. Accordingly, detection sensitivity of the sensor equipment is prevented from reducing.

A method for manufacturing sensor equipment includes the steps of: preparing a sensor device having a sensing portion; preparing a mask having an opening corresponding to the electric connection portion; and depositing a thin film on an electric connection portion by using the mask so that an electric insulation member is formed. The electric connection portion connects the sensor device and an external circuit. In the step of depositing the thin film, the electric connection portion is exposed through the opening of the mask so that the electric connection portion is coated with the thin film. The method provides the sensor equipment having the insulation member made of the deposition film, which is not deteriorated with time. Therefore, the insulation member does not flow out from the connection portion. Accordingly, detection sensitivity of the sensor equipment is prevented from reducing.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
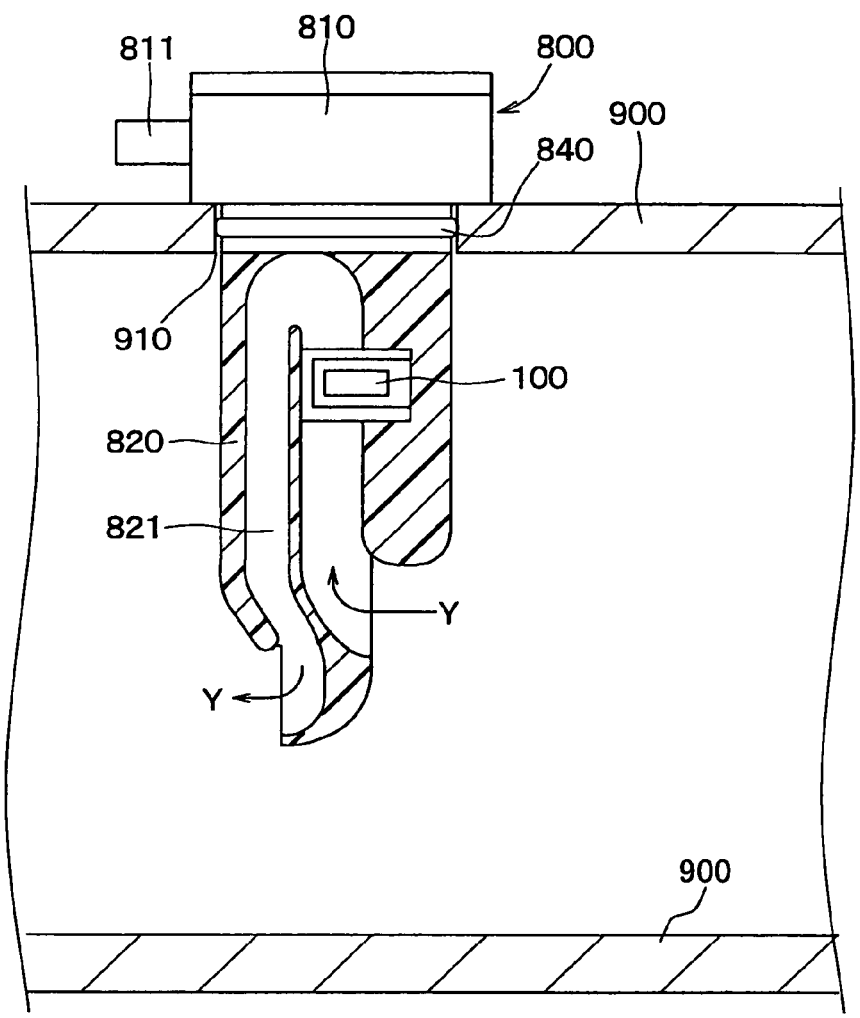
FIG. 1 is a cross sectional view showing sensor equipment mounted on airflow detection equipment, according to a preferred embodiment of the present invention.
Figure 2:
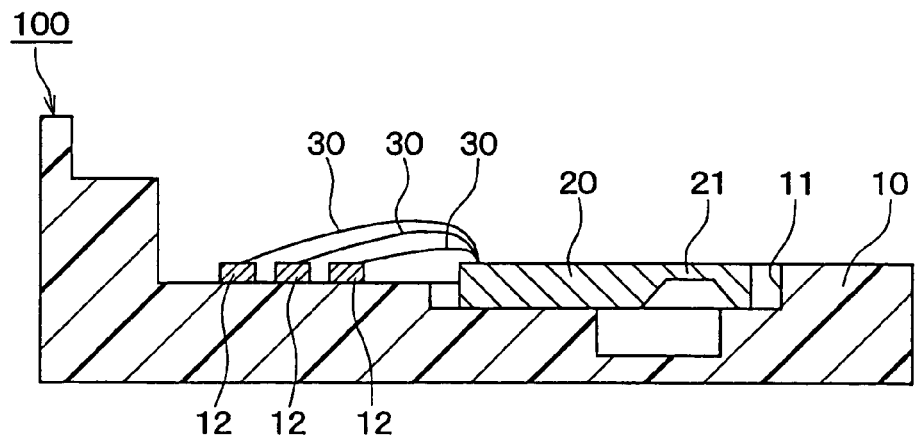
FIG. 2 is a cross sectional view showing the sensor equipment according to the preferred embodiment.

Sensor equipment 100 according to a preferred embodiment of the present invention is shown in FIG. 2. FIG. 1 shows airflow detection equipment 800 having the sensor equipment 100. The sensor equipment 100 is suitably used for a thermal type airflow sensor. The airflow detection equipment 800 is mounted on an intake pipe 900 of an automotive vehicle. Air flows through the intake pipe 900. The airflow detection equipment 800 includes a circuit module 810, an air passage 820 and the sensor equipment 100 as the airflow sensor. The airflow detection equipment 800 is made of resin, which is formed to provide a casing.

As shown in FIG. 1, the air passage of the airflow detection equipment 800 is inserted into a mounting hole 910 of the intake pipe 900. Thus, the air passage 820 is disposed in the intake pipe 900. The mounting hole 910 is sealed with a sealing member 840 such as O-ring. The sealing member 840 is mounted in the airflow detection equipment 800.

The circuit module 810 includes a signal processing circuit (not shown) and a connecter 811. The signal processing circuit is disposed in the circuit module 810. The connector 811 connects to the external circuit. The connector 811 is connected to a wire such as a wire harness. The connector 811 is connected to an engine control unit through the wire electrically.

The air passage 820 includes a bypass passage 821. The bypass passage 821 has an inverse U-shape and bypasses the air from the intake pipe 900. The air from the intake pipe 900 is introduced into the bypass passage 821. Then, the air flows through the bypass passage 821. After that, the air again returns to the intake pipe 900. The sensor equipment 100 is disposed in the air passage 820 to protrude into the bypass passage 821. Thus, a sensing portion 21 of a sensor chip 20 in the sensor equipment 100 is exposed in airflow of the bypass passage 821.

The sensor equipment 100 is mounted on a base and the like with adhesive so that the sensor equipment 100 is fixed to the air passage 820 through the base. The sensor equipment 100 is electrically connected to a circuit in the circuit module 810 through a wire (not shown). In the above airflow detection equipment 800, the sensor equipment 100 exposed in the airflow, which is a detection object, generates a signal corresponding to the airflow amount. The signal is outputted to the circuit module 810. Then, the signal is processed by the circuit module 810. The processed signal is outputted to an engine control unit and the like through the connector 811.

Figure 3:
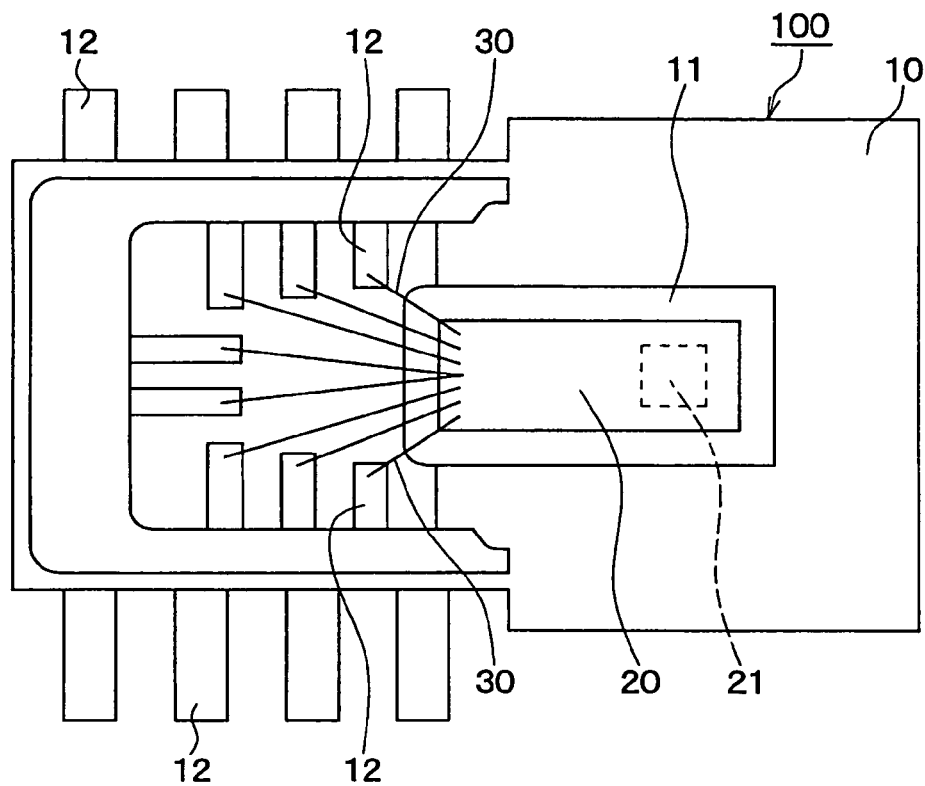
FIG. 3 is a plan view showing the sensor equipment according to the preferred embodiment.
Figure 4:
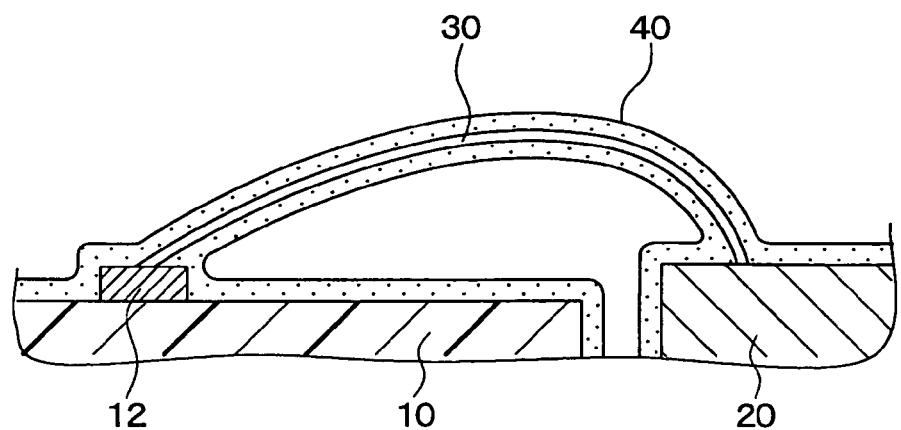
FIG. 4 is a partially enlarged cross sectional view showing an electric insulation member coated on a bonding wire, according to the preferred embodiment.

Next, the sensor equipment 100 is described in detail with reference to FIGS. 2 to 4.

The sensor equipment 100 includes a casing 10, the sensor chip 20 as a sensor device having the sensing portion 21, a bonding wire 30 and an electric insulation member 40. The casing 10 has a terminal 11 for connecting to an external circuit. The sensing portion 21 of the sensor chip 20 detects the airflow amount. The bonding wire 30 connects the sensor chip 20 and the terminal 11 electrically so that the bonding wire works as an electric connection portion. The insulation member 40 covers and protects the bonding wire 30.

The casing 10 of the sensor equipment 100 is made of resin material such as PPS (i.e., poly phenylene sulfide), PBT (i.e., poly butylenes terephthalate) or epoxy resin. Specifically, the casing 10 is formed by a resin mold method. The top of the casing 10 has a concavity 11 for mounting the sensor chip 20. The casing 10 further includes a terminal 12 as a conducting member. The terminal 12 is integrated with the casing 10 by an insert molding method. The terminal 12 is made of conducting material such as copper. A part of the terminal 12 is exposed on the surface of the casing 10. The exposed part of the terminal 12 is disposed near the sensor chip 20. The exposed part of the terminal 12 is coated with gold so that the exposed part works as a bonding pad. The other end of the terminal 12, which is opposite to the exposed part of the terminal 12, is protruded from the casing 10. The protruded part of the terminal 12 can be easily connected to an external wire.

As shown in FIG. 2, the terminal 12 includes eight terminals 12. The terminal 12 works as a terminal for outputting the signal from the sensor equipment 100 to the external circuit.

The sensor chip 20 is, for example, a thin film flow sensor chip for detecting the airflow amount by using temperature dependency of resistance of heat resistor or a temperature sensitive resistor, which is disposed on a membrane. In FIGS. 2 and 3, the sensor chip 20 includes a thin portion of the membrane for the sensing portion 21. The heating resistor or the temperature sensitive resistor is formed on the thin portion.

The sensing portion 21 is exposed in the airflow in the bypass passage 821 of the airflow detection equipment 800. The signal corresponding to the airflow amount is outputted from the sensing portion 21. The sensor chip 20 is manufactured by a conventional semiconductor process such as an etching process so that the chip 20 is formed as a semiconductor chip. For example, the chip 20 is formed from a silicon substrate and the like. The sensor chip 20 is mounted on the bottom of the concavity 11 of the casing 10 with adhesive such as resin and ceramic (not shown). Thus, the sensor chip 20 is bonded to the casing 10. As shown in FIG. 2, the top of the sensor chip 20 and the right upper surface of the casing 10 are almost on the same plane. The sensor chip 20 includes input and output terminals, which are connected to the bonding pads of the terminal 12 through the bonding wire 30 such as gold wire and an aluminum wire.

The bonding wire 30 is a connection portion for connecting the sensor chip 20 and the terminal 12 electrically. Here, the connection portion further includes the bonding wire 30, a connection part between the bonding wire 30 and the sensor chip 20, and another connection part between the bonding wire 30 and the terminal 12.

The sensing portion 21 of the sensor chip 20 is exposed. And the connection portion including the bonding wire 30 is covered with the insulation member 40. The insulation member 40 is formed by an evaporation method so that the connection portion is coated with the insulation member 40. The evaporation method is, for example, a CVD (i.e., chemical vapor deposition) method, a PVD (i.e., physical vapor deposition) method and a sputtering method.

The deposition film as the insulation member 40 is, for example, an organic film such as a Palyrene film or an inorganic film such as a silicon nitride film and a silicon oxide film. Specifically, it is preferred that the Palyrene film is used for coating the electric connection portion.

The sensor equipment 100 is manufactured as follows. Firstly, the terminal 12 is integrated with the casing 10 by the insert molding method. The sensor chip 20 is mounted on the casing 10. The sensor chip 20 and the terminal 12 are connected with the bonding wire. Then, the insulation member 40 is coated on the connection portion including the bonding wire 30 by the evaporation method.

Figure 5A:
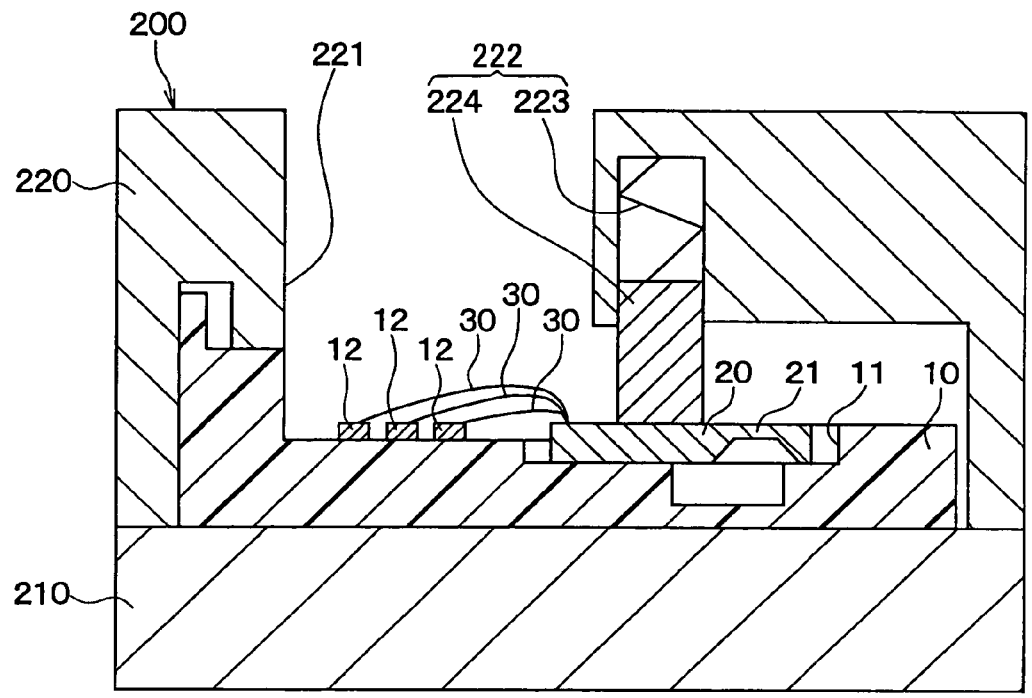
FIG. 5A is a cross sectional view showing the sensor equipment mounted in a mold before the insulation member is formed.
Figure 5B:
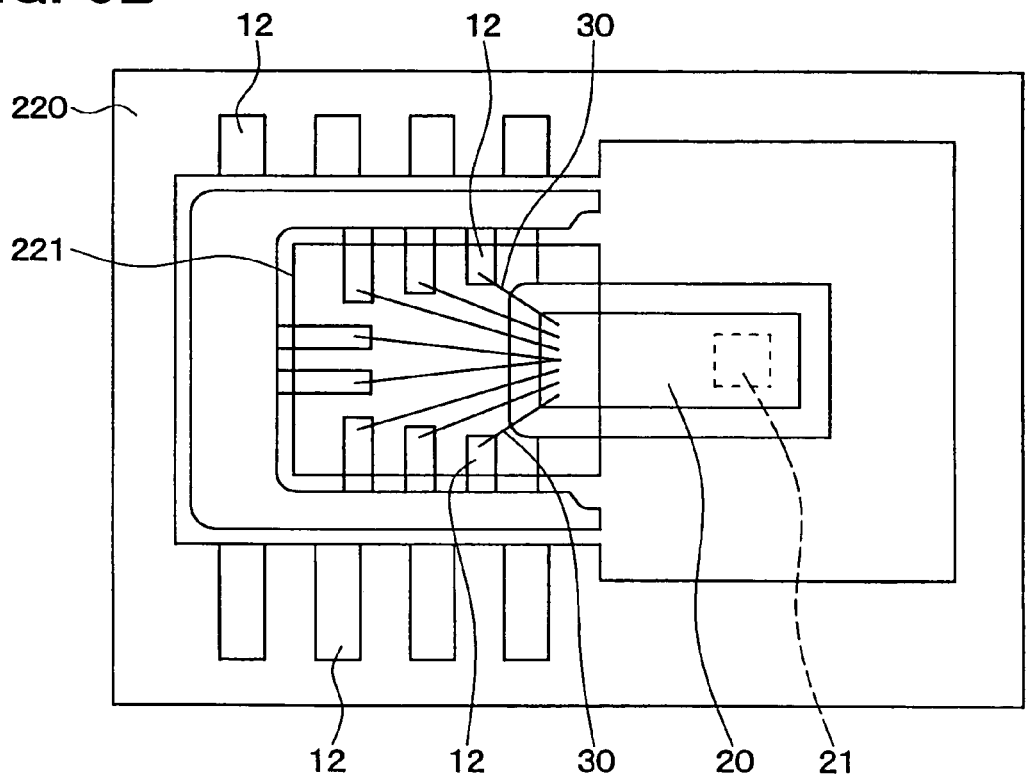
FIG. 5B is a plan view showing the sensor equipment, according to the preferred embodiment.

The formation of the deposition film as the insulation member 40 is described. FIG. 5A shows the sensor equipment 100 before the insulation member 40 is formed. In FIG. 5A, the sensor equipment 100 is mounted on a mold 200 as a mask. FIG. 5B shows the sensor equipment 100 without an upper portion 220 of the mold 200.

The sensor equipment 100 is mounted on the mold 200 as the mask. Then, the deposition film is deposited as the insulation member 40 on the connection portion. Here, the mold 200 includes the upper portion 220 and a lower portion 210, which are engaged together. For example, the sensor equipment 100 is mounted on the lower portion 210 of the mold 200. Then, the upper portion 220 of the mold 200 is covered on the lower portion 210. The upper portion 220 and the lower portion 210 are fixed with a screw and the like.

The upper portion 220 of the mold 200 includes an opening portion 221 corresponding to the connection portion. Further, the upper portion 220 covers the sensing portion 21 of the sensor chip 20. Then, the deposition film as the insulation member 40 is deposited on the connection portion. Thus, the sensor equipment 100 having the connection portion is coated with the insulation member 40. Therefore, the sensing portion 21 of the sensor chip 20 is exposed.

The mold 200 further includes a buffer portion 222 for reducing a force applied to the sensor chip 20. The buffer portion 222 of the mold 200 is disposed on a part, at which the upper portion 220 contacts the sensor chip 20. The buffer portion 222 is composed of a spring 223 and a block 224. The block 224 is mounted on the spring 223.

When the sensor equipment is mounted on the mold 200, the block 224 contacts the sensor chip 20. The force applied to the sensor chip 20 through the block 224 is reduced by the spring 223. Thus, the stress applied to the sensor chip 20 through the mold 200 is reduced. Therefore, damage to the sensor chip 20 is reduced.

Although the buffer portion 222 is composed of the spring 223 and the block 224, the buffer portion 222 can be formed of other parts as long as the buffer portion 222 reduces the force applied to the sensor chip 20. For example, the buffer portion 222 can be composed of a rubber, which is attached on a part, at which the buffer portion 222 contacts the senor chip 20. Specifically, the rubber is disposed in the inner wall of the upper portion 220.

Thus, the electric insulation member 40 is formed on the connection portion including the bonding wire 30 by the evaporation method. Thus, the sensor equipment 100 is completed. The sensor equipment 100 is mounted on the airflow detection equipment 800. Then, the equipment 800 detects the airflow amount in the intake pipe 900 of the automotive vehicle.

In the sensor equipment 100, the insulation member 40 is made of the deposition film, which is not deteriorated with time, compared with a gel film in the convention art. Therefore, the insulation member 40 does not flow out from the connection portion. Accordingly, the insulation member 40 does not adhere to the sensing portion 21 so that the detection sensitivity of the sensor equipment 100 is prevented from reducing. Thus, the electric insulation member 40 has thermostable property so that the insulation member 40 does not flow from the connection portion. Accordingly, the sensing portion is not contaminated with the insulation member 40.

(Modifications)

Although the sensor equipment 100 is used for the airflow sensor, the sensor equipment 100 can be used for other sensors. For example, the sensor equipment 100 can be used for a humidity sensor, a gas sensor, a photo sensor, a pressure sensor, and a DPF (diesel particulate filter) sensor. Specifically, the sensor equipment 100 can be used for a sensor, which is required to have environmental resistance properties.

Such changes and modifications are to be understood as being within the scope of the present invention as defined by the appended claims.

What is claimed is:

1. Sensor equipment comprising:
   a sensor device having a sensing portion; and
   an electric connection portion coated with an electric insulation member, wherein the electric connection portion electrically connects an external circuit and the sensor device,
   the electric insulation member is a thin film disposed on the electric connection portion, wherein the thin film is made of a Palyrene film; and
   the electric connection portion includes a bonding wire, a connection part between the bonding wire and the sensor device, and another connection part between the bonding wire and the external circuit.

2. The equipment according to claim 1, wherein
   the sensor device detects airflow amount by using a heat resistor or a temperature sensitive resistor as the sensing portion, and
   the electric insulation member has thermostable property.

3. The equipment according to claim 1, wherein the bonding wire is an external wire, the bonding wire includes a part other than the connection part and the another connection part, which is separated from the sensor device, and the Palyrene film protects the bonding wire.

4. The equipment according to claim 3, wherein the Palyrene film is a vapor deposition thin film, and the Palyrene film covers a surface of the sensor device other than the sensing portion.

* * * * *